United States Patent [19]

Higuchi et al.

[11] 3,778,639

[45] Dec. 11, 1973

[54] TRANSISTOR SWITCH USING A CURRENT SHARING PULSE TRANSFORMER

[75] Inventors: Hobart Atsushi Higuchi; Lawrence Paul Trubell, both of San Jose, Calif.

[73] Assignee: International Business Machines Corporation, Armonk, N.Y.

[22] Filed: May 12, 1972

[21] Appl. No.: 252,766

[52] U.S. Cl. .................... 307/254, 307/270

[51] Int. Cl. .................... H03k 17/60, H03k 17/06

[58] Field of Search .................... 307/243, 254, 270, 307/275

[56] References Cited

UNITED STATES PATENTS

| | | | |
|---|---|---|---|
| 3,213,295 | 10/1965 | Grosch et al. | 307/254 X |
| 3,184,615 | 5/1965 | Stover | 307/254 |
| 3,699,358 | 10/1972 | Wilkinson | 307/242 |

*Primary Examiner*—John Zazworsky
*Attorney*—Edward M. Suden et al.

[57] ABSTRACT

The invention relates to a transistor switch circuit which employs the use of a current sharing pulse transformer. The current sharing pulse transformer has a secondary winding in the emitter circuit of each of the two transistors used within the circuit. Another secondary winding is connected to the bases of the two transistors used. Finally, another secondary winding is connected in the collector circuit of the transistor switch to provide a feedback signal. The current sharing pulse transformer is used to control the turn-on and turn-off of the transistor switch circuit. More specifically, the secondary windings in the emitter circuit controls the turn-off characteristic associated with the two transistors such that they will turn off at the same time.

11 Claims, 5 Drawing Figures

PATENTED DEC 11 1973 3,778,639

TRANSISTOR SWITCH USING A CURRENT SHARING PULSE TRANSFORMER

BACKGROUND OF THE INVENTION

1. Field of the Invention

This invention relates to a transistor switch circuit and, more particularly, to a transistor switch circuit employing a current sharing pulse transformer for controlling the turn-off characteristics of the transistors used within the transistor switch.

2. Prior Art

FIG. 1 shows a transistor switch circuit currently used within the art. When a turn-on signal is applied to the base of transistor Q3, the transistor switch turns on and the collector current is shared by transistors Q1 and Q2 in the ratio as dictated by the size of resistors R1 and R2. The output of the circuit is taken by means of transformer T in series with the collectors of the transistors Q1 and Q2.

Since the circuit is driving an inductive load, there is the inherent delay in the circuit reaction to changes in the on-off signal as applied to the base of transistor Q3. With reference to FIG. 2, a graph is shown relating the total current to the collector current associated with transistors Q1 and Q2. The total current is a summation of the current passing through transistors Q1 and Q2. When the turn-on signal to the base of transistor Q3 is removed, the circuit due to its inductive load does not instantaneously follow that turn-off condition. Due to the inherent differences between discrete transistors either one of the two transistors will turn off first and thereby cause the remaining transistor to carry the total current still flowing within the circuit. This can be seen again by referring to FIG. 2 which shows transistor Q2 shutting down before transistor Q1 and therefore causing transistor Q1 to carry the great majority of the current associated with the total current during turn-off time.

This condition of unequal turn-off of the two transistors within the transistor switch is undesirable since it accounts for the burning out or the shortening of the life expectancy of the components of the transistor switch.

It is therefore the object of this invention to provide a transistor switch circuit having a means for ensuring that the transistors used within the circuit will turn off at the same time thereby preventing burn out or early aging of the components within the transistor switch.

Another object of the invention is the use of a current sharing pulse transformer as the means for controlling the turning on and the turning off of the current switch while ensuring that the two transistors used within the transistor switch turn off at the same time.

It is still another object of the invention to provide another means within the transistor switch such that the current sharing pulse transformer used needs only to drive the base current associated with the transistors in the transistor switch circuit.

SUMMARY OF THE INVENTION

Briefly, the invention relates to the use of a current sharing pulse transformer in a transistor switch circuit. The current sharing pulse transformer has a secondary winding in each of the emitter circuits of the two transistors used in the current switch. Another secondary winding is connected to the bases of the two transistors for controlling the turn-on and turn-off of the circuit.

The secondary winding in the emitters of the two transistors are so related that an increase or decrease in current in one emitter secondary winding will cause a corresponding increase or decrease of current in the other emitter winding. The interaction causes the two transistors to track each other and therefore turn off at the same time. Another winding is connected to the collectors of the two transistors and is used to provide a regenerative feedback signal to the magnetic circuit such that the primary of the current sharing pulse transformer need only provide the energy that is associated with driving the base current associated with the two transistors within the transistor switch.

The advantage of the use of a current sharing pulse transformer within the transistor switch is that it ensures that the turn off of the transistors used within the transistor switch will occur at the same time and therefore prevent burn-out of components of early aging of components used within the current switch. Further, by the use of the feedback winding the necessary energy being introduced into the transistor switch is only that energy necessary to drive the base current associated with the two transistors when the current switch is turned on.

BRIEF DESCRIPTION OF THE DRAWINGS

The foregoing and other objects, features and advantages of the invention will be apparent from the following more particular description of the preferred embodiment of the invention as illustrated in the accompanying drawings.

DESCRIPTION OF THE PREFERRED EMBODIMENT

Figures 3, 4, 5:
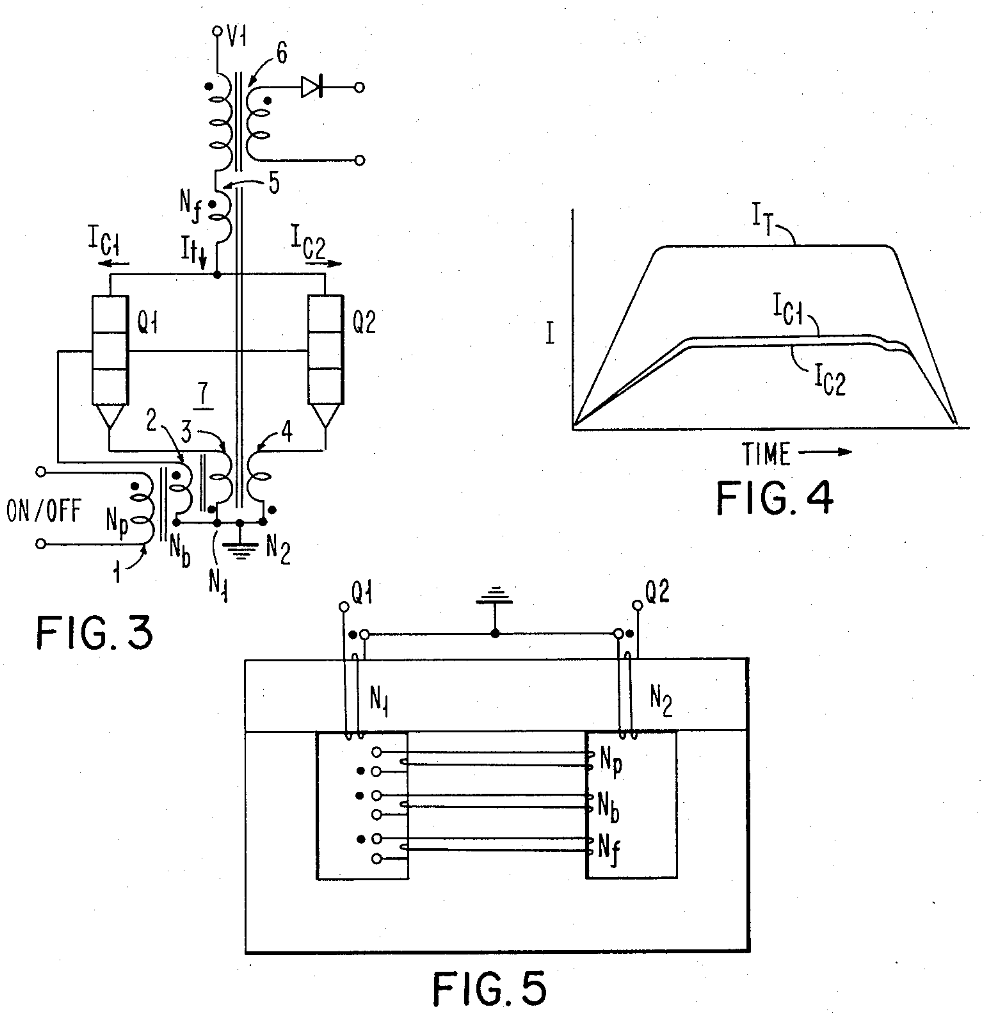
FIG. 3 is a schematic drawing of the preferred embodiment of the transistor switch using a current sharing pulse transformer of the invention.
FIG. 4 is a graphic representation of the current associated with the two transistors used in the transistor switch and the total current of the circuit as shown in FIG. 3.
FIG. 5 shows the structure of the current sharing pulse transformer used in FIG. 3.

FIG. 3 shows the schematic diagram for the preferred embodiment of the invention. The transistor switch comprises transistors Q1 and Q2. The bases of transistors Q1 and Q2 are directly coupled together. The collectors of transistors Q1 and Q2 are directly coupled together.

Figure 1:
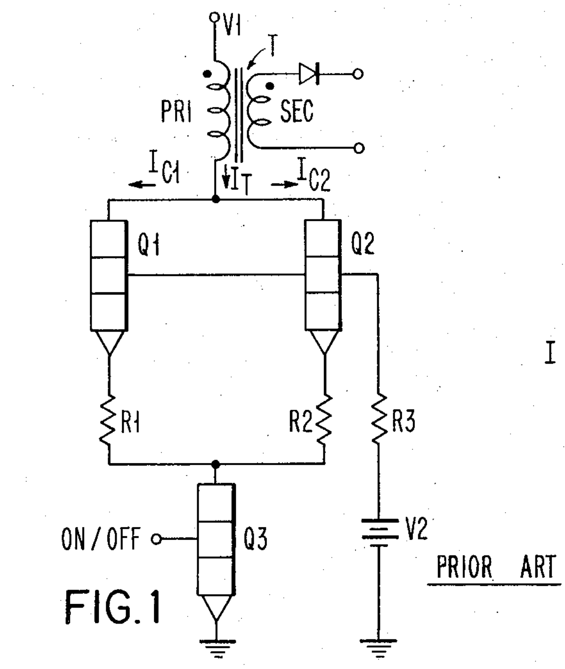
FIG. 1 is a schematic drawing of a transistor switch as presently known in the art.
Figure 2:
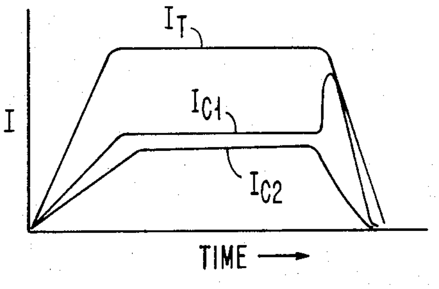
FIG. 2 is a graphic representation of the current in the two transistors and the total current associated with the transistor switch during a turn-on and turn-off operation of the circuit shown in FIG. 1.

The current sharing pulse transformer 7 has primary winding 1, secondary base winding 2, secondary first emitter winding 3, secondary second emitter winding 4 and secondary feedback winding 5. The phase relationship of the secondary windings to the primary windings are as indicated by the dots associated with each of the windings for the current sharing pulse transformer 7. Each winding is assumed to have a positive and negative terminal and the dot in FIG. 2a associated with each of the windings indicates the positive terminal.

The secondary base winding 2 has its positive terminal connected to the bases of transistors Q1 and Q2.

The negative terminal of the secondary base winding is connected to ground. The second first emitter winding 3 has its negative terminal connected to the emitter of transistor Q1 and its positive terminal connected to ground. In like manner, secondary second emitter winding 4 has its negative terminal connected to the emitter of transistor Q2 and its positive terminal connected to ground. Finally, the secondary feedback winding 5 has its negative terminal connected to the collectors of transistors Q1 and Q2 and its positive terminal is connected to output transformer 6. Output transformer 6 is used to develop an output signal from the transistor switch and has the other side of its primary winding attached to the power supply.

FIG. 5 is a diagram showing the magnetic core structures upon which the secondary and primary windings are wound. It should be noted that the standard convention for determining the location of the dots has been used. The convention takes into account the direction in which each winding is wound, the direction of current in each winding and the direction of magnetic flux. The transformer core may be molded in a single piece or it may be an E-shaped core having a cross bar closing the E to form the necessary closed magnetic structure. It is well known that the E type structure allows ease of winding the coils on the structure and for that reason, it is preferred by many. A critical designed parameter for the magnetic circuit is that the flux flowing through the two outside legs must be essentially equal for proper operation of the invention. Therefore, when bonding the cross bar to the E shaped structure, the resulting bonding gap on both sides should be equal. Further, it is desired to have a low reluctance path for the magnetic flux through the magnetic structure and therefore the area of joining the cross bar to the E shaped structure should be as large as possible.

Another solution to attaining a uniform low reluctance magnetic circuit is to have the magnetic core pressed into its final shape. This of course provides a difficult problem in winding the windings in the closed structure. However, it does provide the advantage of being able to design the magnetic structure with the desired equal reluctance paths through the outer legs.

It has been found, however, that the use of the E-shaped magnetic structure with its cross bar can be manufactured quite easily while maintaining the requirement of the low reluctance and equal paths for the outer length of the E structure.

In operation, the turn-on pulse is coupled from the primary to the secondary windings and appears as a constant current pulse to the circuit. The induced signal in the secondary base winding turns on transistors Q1 and Q2. The input pulse being of a constant current type is such that the current induced in the secondary base winding will have a value equal to the necessary base current for the two transistors Q1 and Q2 when they are conducting.

Secondary first emitter winding 3 and secondary second emitter winding 4 are so wound on the closed magnetic core structure that an increase or decrease in current in either of the emitter windings will cause a corresponding increase or decrease in the other emitter winding. The method of winding coils on the core structure can clearly be seen from FIG. 5. The cores associated with the secondary first emitter winding and the secondary second emitter winding have the number of turns as indicated in FIG. 5 by $N_1$ and $N_2$, respectively.

It is further desired that the primary circuit of the current sharing pulse transformer 7 to only deliver that energy which is necessary to supply the necessary base current for transistors Q1 and Q2 when transistors Q1 and Q2 are conducting. To obtain this result, secondary feedback winding 5 has been introduced into the circuit. The number of turns associated with secondary feedback 5 is $N_f$.

From FIGS. 3 and 5, the following equation may be written:

$$I_pN_p = (I_{b1} + I_{b2})N_b + I_{e1}N_1 - I_tN_f \quad (1)$$

$$I_pN_p = (I_{b1} + I_{b2})N_b + I_{e2}N_2 - I_tN_f \quad (2)$$

Subtracting (1) and (2) yields $$Ie_1N_1 - Ie_2N_2 = 0 \quad (3)$$

$$Ie_1N_1 = Ie_2N_2 \quad (4)$$

Thus, since it is desired to have $$Ie_1 = Ie_2, \quad (5)$$

then $$N_1 = N_2 \quad (6)$$

Substituting (6) into (2) and adding (1) and (2)

$$2I_pN_p = 2(I_{b1} + I_{b2})N_b + (Ie_1 + Ie_2)N_1 - 2I_tN_f \quad (7)$$

Further $$Ie_1 = I_{b1} + I_{c1} \quad (8)$$

$$I_{e2} = I_{b2} + I_{c2} \quad (9)$$

$$I_t = I_{c1} + I_{c2} \quad (10)$$

Substituting (8), (9) and (10) into (7)

$$2I_pN_p = 2(I_{b1} + I_{b2})N_b + (I_{b1} + I_{c1} + I_{b2} + I_{c2})N_1 - 2(I_{c1} + I_{c2})N_f \quad (11)$$

$$2I_pN_p = 2(I_{b1} + I_{b2})N_b + (I_{B1} + I_{b2})N_1 + (I_{c1} + I_{c2})N_1 - 2(I_{c1} + I_{c2})N_f \quad (12)$$

It is desired to have the feedback source component $2(I_{c1} + I_{c2})N_f$ supply the energy for the sink component $$(I_{c1} + I_{c2})N_1,$$

thus $$(I_{c1} + I_{c2})N_1 - 2(I_{c1} + I_{c2})N_f = 0 \quad (13)$$

Solving (13) yields $$N_1 = 2N_f \quad (14)$$

$$N_f = N_1/2 \quad (15)$$

Substituting (13) into (12)

$$2I_pN_p = 2(I_{b1} + I_{b2})N_b + (I_{b1} + I_{b2})N_1 \quad (16)$$

$$I_pN_p = (I_{b1} + I_{b2})\,(N_b + 0.5N_1) \quad (17)$$

Therefore, it can be seen from equation 17, the only current that is to be driven by the primary circuit is that associated with the base current of the two transistors Q1 and Q2 used within the circuit.

It should also be noted that the above derivation has also specified in equation 6 that the number of turns in the secondary first emitter winding and the secondary second emitter winding are to be the same. Equation 15 shows that the secondary feedback winding should have one half the number of turns as the emitter windings. Finally, the values for the $N_p$ and $N_b$ may be calculated upon the specification of $I_b$ and $I_p$ for the given type of transistor used for transistors Q1 and Q2.

The number of turns in the emitter windings $N_1$ and $N_2$ are arbitrary and have no critical value except that the magnetic circuit should never become saturated. However, since $N_l$ is added to $N_b$ in equation 17, it would be desirous to have $N_1$ as small as possible. Typical values for the current sharing pulse transformer are $N_p = 175$, $N_b = 14$, $N_1 = 4$, $N_2 = 4$ and $N_f = 2$.

In operation, when both transistors Q1 and Q2 are conducting, $I_{el}$ equals $I_{e2}$ by design. During turn off, this equality does not normally exist since one of the transistors turns off first due to the difference in the turn off characteristic from one transistor to another transistor of the same type. Assume therefore that transistor Q1 tends to shut off first, thereby causing $$I_{el} < I_{e2} \quad (18)$$

The feedback winding at the same time is causing the same induced EMF to appear as both emitter windings. This EMF on the second emitter winding would have generated $I_{e2} \cong I_t/2$ during a normal conducting period, however, under this condition $I_{e2} > I_t/2$. The amount $\Delta I_2$ by which $I_2$ is greater than $I_t/2$ during this turn off period causes the second emitter winding to act as a source of energy which imparts additional lines of magnetic flux into the core. This increase in magnetic flux causes a corresponding increase in the EMF generated on the first emitter winding, thereby tending to drive transistor Q1 back into conduction such that $I_{el} = I_{e2}$. This is a dynamic action and causes the two transistors Q1 and Q2 to track each other during turn off such that both stop conducting at essentially the same time.

With reference to FIG. 4, a graph is shown of current versus time. It should be noted that the current through the two transistors Q1 and Q2 essentially track each other during the turn-off period. This provides the desired results and eliminates the burning out or early aging of the components of the transistor switch.

In view that the circuit was initially driving an inductive load, the additional delay time introduced into the circuit by the use of the current sharing pulse transformer 7 is not prohibitive, and by judicial design may be kept to a small value such that the output transformer 6 is still the determining factor in the amount of delay in the response time. Therefore the incorporation of the current sharing pulse transformer 7 has provided the desired advantages while not deteriorating the response time of the circuits as presently known in the art.

It will be realized by those skilled in the art that the transistor switch circuit herein described will inherently have the same turn on characteristics for the two transistors used due to the incorporation into the circuit of the current sharing pulse transformer.

While the invention has been particularly shown and described with reference to the preferred embodiment, it will be understood by those skilled in the art that various changes in form and detail may be made therewithin without departing from the spirit and scope of the invention.

What we claim is:

1. A transistor switch circuit comprising:

a first and second transistor;

a current sharing pulse transformer having a primary winding and having a first secondary winding connected to the base of said transistors and having a second and third secondary winding connected to the emitter of each transistor for controlling the turn-off and turn-on of said transistors and for causing the turn-off characteristics of each of said transistors to be the same whereby both transistors turn-off at the same time, said current sharing pulse transformer further comprising a fourth secondary feedback winding connected to the collector of said transistors for causing said primary winding to supply only that energy necessary for providing the base current of said transistors within said circuit.

2. A transistor switch circuit comprising:

a first and second transistor;

a current sharing pulse transformer having a primary winding and having a first secondary winding connected to the base of said transistors and having a second and third secondary winding connected to the emitter of each transistor for controlling the turn-on and turn-off of said transistors and for causing the turn-off characteristics of each of said transistors to be the same whereby both transistors turn-off at the same time, wherein all said primary and secondary windings are wound on a closed magnetic core structure, said second and third secondary windings connected to said emitters being so placed on said core that a decrease or increase of current in one emitter winding will cause a corresponding decrease or increase of current in the other emitter winding for causing the emitters of said transistors to track each other and to turn-off at the same time.

3. A transistor switch circuit as set forth in claim 1 wherein all said primary and secondary windings are wound on a closed magnetic core structure, said second and third secondary windings being so placed on said core that a decrease or increase of current in one emitter winding will cause a corresponding decrease or increase of current in the other emitter winding for causing the emitters of said transistors to track each other and turn-off at the same time.

4. A transistor switch circuit comprising:

a first and second transistor, each said transistor having a base, a collector and an emitter, said bases being directly connected together and said collectors being directly connected together;

a current sharing transformer having a primary winding, a secondary base winding, a secondary first emitter winding, a secondary second emitter winding, and a secondary feedback winding, each of said windings having a positive and a negative terminal which defines the sense of said secondary windings to said primary windings;

the positive terminal of said base winding being connected to said connected bases;

the negative terminal of said first emitter winding being connected to the emitter of said first transistor;

the negative terminal of said second emitter winding being connected to the emitter of said second transistor;

the negative terminal of said feedback winding being connected to said connected collectors; and all said primary and secondary windings being wound on a closed magnetic core structure.

5. The transistor switch circuit as claimed in claim 4 further comprising a means in series of said feedback winding for providing an output signal from said transistor switch circuit.

6. The transistor switch circuit as claimed in claim 4 wherein said negative terminal of said base winding and said positive terminals of said emitter windings are connected to ground.

7. The transistor switch circuit as claimed in claim 5 wherein said negative terminal of said base winding and said positive terminals of said emitter windings are connected to ground.

8. A transistor switch circuit as set forth in claim 4 wherein said first and second emitter windings are so placed on said magnetic core structure that an increase or decrease in current in one of said emitter windings will cause a corresponding increase or decrease of current in the other emitter winding for causing the emitter circuits of said first and second transistors to track each other and to turn off at the same time.

9. The transistor circuit as set forth in claim 8 further comprising a means and series with said feedback winding for providing an output signal from said transistor switch circuit.

10. A transistor circuit as set forth in claim 8 wherein said negative terminals of said base winding and said positive terminals of said emitter windings are connected to ground.

11. The transistor switch circuit as set forth in claim 9 wherein said negative terminal of said base winding and said positive terminals of said emitter winding are connected to ground.

* * * * *